US008617786B2

United States Patent
Dipietro et al.

(10) Patent No.: US 8,617,786 B2
(45) Date of Patent: Dec. 31, 2013

(54) POLY-OXYCARBOSILANE COMPOSITIONS FOR USE IN IMPRINT LITHOGRAPHY

(75) Inventors: Richard Anthony Dipietro, Campbell, CA (US); Geraud Jean-Michel Dubois, Los Gatos, CA (US); Robert Dennis Miller, San Jose, CA (US); Ratnam Sooriyakumaran, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 176 days.

(21) Appl. No.: 13/026,168

(22) Filed: Feb. 11, 2011

(65) Prior Publication Data

US 2011/0136928 A1   Jun. 9, 2011

Related U.S. Application Data

(62) Division of application No. 11/467,862, filed on Aug. 28, 2006, now Pat. No. 7,927,664.

(51) Int. Cl.
*G03F 7/038* (2006.01)
*G03F 7/075* (2006.01)

(52) U.S. Cl.
USPC ........ 430/270.1; 430/905; 430/914; 430/916; 430/919; 430/921; 430/923; 430/925; 430/311; 522/148; 522/31; 522/33; 522/37; 522/40; 522/43; 522/46; 522/48; 522/57; 522/59; 522/67

(58) Field of Classification Search
None
See application file for complete search history.

(56) References Cited

U.S. PATENT DOCUMENTS

| | | |
|---|---|---|
| 5,602,060 A | 2/1997 | Kobayashi et al. |
| 5,895,263 A | 4/1999 | Carter et al. |
| 6,171,687 B1 | 1/2001 | Leung et al. |
| 6,613,834 B2 | 9/2003 | Nakata et al. |
| 6,730,617 B2 | 5/2004 | Carter |
| 6,780,498 B2 | 8/2004 | Nakata et al. |
| 6,809,041 B2 | 10/2004 | Interrante et al. |
| 7,648,820 B2 * | 1/2010 | Babich et al. .......... 430/313 |
| 2002/0042020 A1 * | 4/2002 | Gallagher et al. ...... 430/272.1 |
| 2002/0064965 A1 | 5/2002 | Wu |
| 2004/0000715 A1 | 1/2004 | Interrante et al. |
| 2004/0067434 A1 * | 4/2004 | Kano et al. ............. 430/270.1 |
| 2004/0137241 A1 | 7/2004 | Lin et al. |
| 2005/0031964 A1 * | 2/2005 | Babich et al. ............ 430/5 |
| 2005/0194619 A1 | 9/2005 | Edelstein et al. |
| 2005/0202350 A1 | 9/2005 | Colburn et al. |
| 2006/0068526 A1 * | 3/2006 | Takei et al. ............. 438/127 |
| 2006/0084282 A1 | 4/2006 | Dubois et al. |
| 2007/0027287 A1 | 2/2007 | Akiyama et al. |
| 2007/0031687 A1 | 2/2007 | Akiyama et al. |
| 2007/0148974 A1 | 6/2007 | Uh et al. |

OTHER PUBLICATIONS

Colburn et al., Step and Flash Imprint Lithography: A New Approach to High-Resolution Patterning, Proceedings of SPIE 3676(I): 379-389 (1999).
Stewart et al., Direct Imprinting of Dielectric Materials for Dual Damascene Processing, Proceedings of SPIE, 5751:210-218 (2005).

* cited by examiner

*Primary Examiner* — Sin Lee
(74) *Attorney, Agent, or Firm* — Karen Canaan; CanaanLaw, P.C.

(57) ABSTRACT

The present invention relates to compositions comprising poly-oxycarbosilane and methods for using the compositions in step and flash imprint lithography. The imprinting compositions comprise a poly-oxycarbosilane polymer, a silanol, a reaction initiator and optionally a pore generator.

8 Claims, 6 Drawing Sheets

FIG. 1D"

POLY-OXYCARBOSILANE COMPOSITIONS FOR USE IN IMPRINT LITHOGRAPHY

CROSS-REFERENCE TO RELATED APPLICATIONS

This application is a divisional of U.S. patent application Ser. No. 11/467,862, filed on Aug. 28, 2006 now U.S. Pat. No. 7,927,664.

FIELD OF THE INVENTION

This invention relates to compositions comprising poly-oxycarbosilane and methods for using the compositions in step and flash imprint lithography.

BACKGROUND OF THE INVENTION

Semiconductor devices such as microprocessors, microcontrollers and communication chips are used extensively in electronic devices including computers. Generally semiconductor devices include a plurality of integrated circuits (ICs). ICs can contain millions of transistors and other circuit elements fabricated on a single semiconductor chip. Semiconductor devices require many layers of wiring to interconnect devices such as field effect and bipolar transistors into integrated circuits. Two major factors limit the signal speed of advanced semiconductor devices. The first is the wiring density which is generally a function of wire dimensions. The second is the capacitance of the device which is a function of the dielectric constant of the material insulating the wires. Therefore, to increase signal speed for semiconductor devices, there is an ongoing need for compositions and processes for fabricating semiconductor devices that have dense wiring and have low capacitance.

SUMMARY OF THE INVENTION

The present invention relates to compositions and methods for imprint lithography. A first aspect of the present invention relates to a composition for use in manufacturing semiconductor devices. The composition comprises a poly-oxycarbosilane polymer, a silanol and a reaction initiator to promote crosslinking between the poly-oxycarbosilane and the silanol. In a preferred embodiment, the reaction initiator is selected from a photoacid generator and a thermal acid generator. Optionally, the composition can also comprise a pore generator.

A second aspect of the present invention relates to a method for forming a semiconductor structure. The method generally comprises (a) disposing on a substrate a precursor dielectric layer comprising a polymerizable composition comprising a silanol, a reaction initiator and a poly-oxycarbosilane; (b) pressing a relief pattern on a surface of a template into the exposed surface of the precursor dielectric layer; (c) polymerizing the precursor dielectric layer; (d) curing the precursor dielectric layer to form a dielectric layer having thick and thin regions corresponding to the relief pattern; and lastly (e) depositing a conductive material onto the exposed surface of the dielectric layer after the template has been removed. Suitably, the precursor dielectric layer is a liquid. The dielectric material can be cured after polymerizing the precursor dielectric layer and before or after removing the template.

BRIEF DESCRIPTION OF DRAWINGS

The features of the invention are set forth in the appended claims. The invention itself, however, will be best understood by reference to the following detailed description of illustrative embodiments when read in conjunction with the accompanying drawings, wherein:

FIG. 2A a top view illustrating the section through which FIG. 1F is taken;

DETAILED DESCRIPTION OF THE INVENTION

Figure 1A:
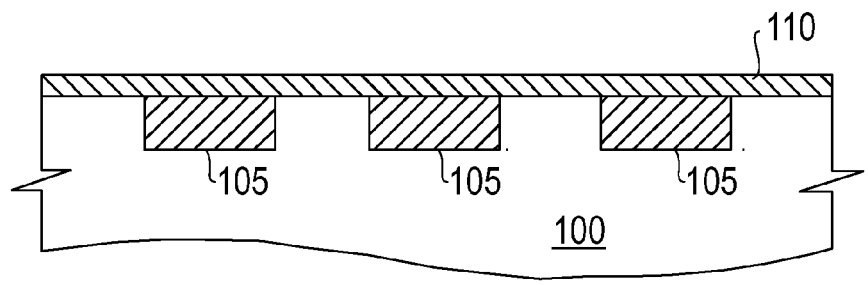
FIGS. 1A through 1F are cross sectional views of a method of fabricating a dual damascene wire according to an embodiment of the present invention.

The imprintable precursor dielectric compositions of the present invention include a polymerizable poly-oxycarbosilane polymer, a silanol and a reaction initiator. The precursor dielectric compositions may further include a pore generator and/or a solvent. The compositions may also include other materials to improve the methods and compositions of the present invention such as beta-diketones, colloidal silica, colloidal alumina, surfactants, water, silane coupling agent, radical generating agents, triazene compounds and the like.

The poly-oxycarbosilane polymer of the present invention is a polymerizable polymer comprising a repeating unit having a structure selected from one of the following structures I and II:

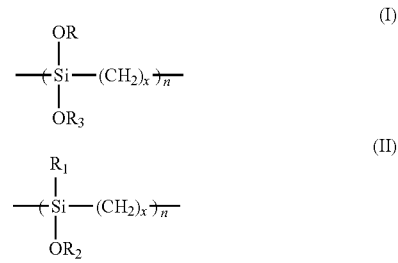

where R, $R_1$, $R_2$, and $R_3$ are independently selected from hydrido, $C_{1-6}$ alkyl and haloalkyl, such as methyl, fluoroethyl, propyl; $C_{4-7}$ cycloalkyl and halocycloalkyl; $C_{1-6}$ alkylenyl and haloalkylenyl; and $C_{6-12}$ aryl and haloaryl (where aryl includes alkylaryl), such as phenyl, naphthyl, methylphenyl and chlorophenyl; x is 1 to 4 preferably 1 to 2 and n=2 to 5000, suitably 5 to 500.

In an alternative embodiment, one or more of R, $R_1$, $R_2$, and $R_3$ are independently selected from a polymerizable substituent derived from acrylate, methacrylate and vinyl ether such as $C_{3-4}$ alkylenylcarbonyloxy or $C_{5-10}$ cycloalkylenylcarbonyloxy. The polymerizable substituent could polymerizes in the process to form a carbosilane network. Alternatively, one or more of R, $R_1$, $R_2$, and $R_3$ could be independently selected from a carbosilane substituent known to those skilled in the art which would form a hyperbranched polymer in the process.

Suitable silanols include organosilicates, such as those disclosed in U.S. Pat. No. 5,895,263 to Carter et al. (incorporated herein by reference), including the family of organosilicates known as silsesquioxanes, $(RSiO_{1.5})n$. Suitable silsesquioxanes for the present invention include hydrido (R=hydrido), alkyl (R=methyl, ethyl, propyl, and higher alkyl), aryl (R=phenyl) or alkyl/aryl, vinyl, and copolymers thereof, as well as polymethylsilsesquioxane (PMSSQ), which are commercially available from Owens Corning, JSR Micro and Shin-Etsu, for example. Most commonly, the silsesquioxane is poly (methyl silsesquioxane), $((CH_3)SiO_{1.5})n$, and n is 10 to 500 or more (including copolymers). As used herein organosilicates include silsesquioxane thermoset resins generally represented by the formula $(RSiO_{1.5})_n$ as described above, including copolymers of one or more of the monomers $(Si(R)_{1.5})$, $(SiO_2)$, $(SiR_2O)$, and $(R_3SiO)$, in which R is defined above. The organosilicate suitably has a molecular weight of about 600 to 30,000 daltons.

Suitable silanols also include small silanol molecules such as $R_mSi(OH)_{4-m}$ where each $R_m$ is independently selected from hydrido, $C_{1-6}$ alkyl and haloalkyl such as methyl, fluoroethyl and propyl; $C_{1-6}$ alkenyl and haloalkenyl; $C_{6-12}$ aryl and haloaryl, such as phenyl, naphthyl, methylphenyl and chlorophenyl. The silanol can be added to the composition as part of the mixture or as a coating on silica nanoparticles.

Suitable reaction initators for the compositions of the present invention include photo and thermal radical initiators, photo-acid and thermal acid generators and photo and thermal base generators known to those skilled in the art. Suitable photo radical initiators include but are not limited to: acetophenone, anisoin, anthraquinone, anthraquinone-2-sulfonic acid, (benzene)tricarbonylchromium, benzil, benzoin, benzoin ethyl ether, benzoin isobutyl ether, benzoin methyl ether, benzophenone, 3,3',4,4'-benzophenonetetracarboxylicdianhydride, 4-benzoylbiphenyl, 2-benzyl-2-dimethylamino)-4'-morpholinobutyrophenone, 4,4'-bis(diethylamino)benzophenone, 4,4'-bis(dimethylamino) benzophenone, camphorquinone, 2-chlorothioxanthen-9-one, (cumene)cyclopentadienyliron(II) hexafluorophosphate, dibenzosuberenone, 2,2-diethoxyacetophenone, 4,4'-dihydroxybenzophenone, 2,2-dimethoxy-2-phenylacetophenone, 4-(dimethylamino)benzophenone, 4,4'-dimethylbenzil, 2,5-dimethylbenzophenone, 3,4-dimethylbenzophenone, diphenylbis(2,4,6-trimethylbenzoyl) phosphine oxide, 4'-ethoxyacetophenone, 2-ethylanthraquinone, ferrocene, 3'-hydroxyacetophenone, 4'-hydroxyacetophenone, 3-hydroxybenzophenone, 4-hydroxybenzophenone, 1-hydroxycyclohexyl phenyl ketone, 2-hydroxy-2-methylpropiophenone, 2-methylbenzophenone, 3-methylbenzophenone, methybenzoylformate, 2-methyl-4'-(methylthio)-2-morpholinopropiophenone, phenanthrenequinone, and 4'-phenoxyacetophenone, thioxanthen-9-one.

Suitable photo-acid generators include, but are not limited to: sulfonium salt, triphenylsulfonium perfluoromethanesulfonate (triphenylsulfonium triflate), triphenylsulfonium perfluorobutanesulfonate, triphenylsulfonium perfluoropentanesulfonate, triphenylsulfonium perfluorooctanesulfonate, triphenylsulfonium hexafluoroantimonate, triphenylsulfonium hexafluoroarsenate, triphenylsulfonium hexafluorophosphate, triphenylsulfonium bromide, triphenylsulfonium chloride, triphenylsulfonium iodide, 2,4,6-trimethylphenyldiphenylsulfonium perfluorobutanesulfonate, 2,4,6-trimethylphenyldiphenylsulfonium benzenesulfonate, tris(t-butylphenyl)sulfonium, diphenylethylsulfonium chloride, phenacyldimethylsulfonium chloride, halonium salts, diphenyliodonium perfluoromethanesulfonate (diphenyliodonium triflate), diphenyliodonium perfluorobutanesulfonate, diphenyliodonium perfluoropentanesulfonate, diphenyliodonium, diphenyliodonium hexafluoroantimonate, diphenyliodonium hexafluoroarsenate, bis-(t-butylphenyl)iodonium triflate, bis-(t-butylphenyl)-iodonium camphorsulfonate, α,α'-bis-sulfonyl diazomethanes, bis(p-toluenesulfonyl)diazomethane, methylsulfonyl p-toluenesulfonyldiazomethane, 1-cyclohexylsulfonyl-1-(1,1-dimethylethylsulfonyl) diazomethane, bis(cyclohexylsulfonyl)diazomethane, trifluoromethanesulfonate esters of imides and hydroxyimides, (trifluoromethylsulfonyloxy)-bicyclo[2.2.1]hept-5-ene-2,3-dicarboximide (MDT), nitrobenzyl sulfonate esters, 2-nitrobenzyl p-toluenesulfonate, 2,6-dinitrobenzyl p-toluenesulfonate, 2,4-dinitrobenzyl p-trifluoromethylbenzenesulfonate, sulfonyloxynaphthalimides, N-camphorsulfonyloxynaphthalimide and N-pentafluorophenylsulfonyloxynaphthalimide, pyrogallol derivatives (e.g., trimesylate of pyrogallol), naphthoquinone-4-diazides, alkyl disulfones, s-triazine derivatives, sulfonic acid generators, t butylphenyl-α-(p-toluenesulfonyloxy)-acetate, t-butyl-α-(p-toluenesulfonyloxy) acetate, N-hydroxy-naphthalimide dodecane sulfonate (DDSN), and benzoin tosylate and materials represented by the following structures III, IV, and IV:

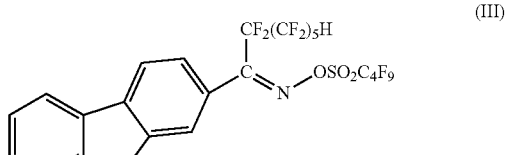

(III)

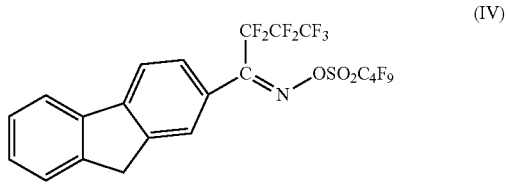

(IV)

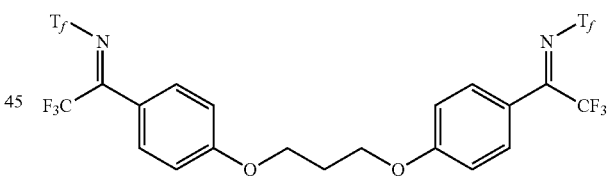

(V)

wherein $T_f = CF_3S(O)_2O—$.

Suitable thermal acid generators which generate acid upon thermal treatment include, but are not limited to 2,4,4,6 tetrabromocyclohexadienone, benzoin tosylate, 2-nitrobenzyl tosylate and other alkyl esters of organic sulfonic acids. Compounds that generate a sulfonic acid upon activation are generally suitable. Other suitable thermally activated acid generators are described in U.S. Pat. Nos. 5,886,102 to Sinta et al. and 5,939,236 to Pavelchek et al.

The composition may optionally comprise a decomposable polymer, i.e., a pore generator. The pore generator functions to reduce the dielectric constant of the composition after thermal curing; however, the pore generator also modulates the viscosity of the dielectric composition. Suitable pore generators include, but are not limited to: a linear or branched polymer selected from the group consisting of polyesters, polylactides, polystyrenes, substituted polystyrenes, poly-alpha methyl styrenes, substituted poly-alpha methyl styrenes, aliphatic olefins, polynorbornenes, polyacrylates, polymethacrylates and aliphatic polyethers. A suitable aliphatic polyether is selected from the group consisting of polyethylene oxide, polypropylene oxide and polytetrahydrofuran. Cyclodextrins may also be used as a pore generator.

The pore generator polymers may be selected from hyperbranched polymers, a linear di- or triblock copolymer, a radial block copolymer or a polymeric unimolecular amphiphile. Optionally, the pore generator can be bonded as a substituent to the poly-oxycarbosilane.

Though not limited to any single use, the present invention may be advantageously used to fabricate damascene and dual-damascene wires and vias.

The present invention combines step and flash imprint lithography with materials that can be converted to low dielectric constants (where k, the dielectric constant, is less than about 3.9) in order to fabricate damascene and dual-damascene interconnect structures for integrated circuits. Step and flash imprint lithography is used with a photosensitive or thermally sensitive pre-dielectric material that is molded between a template having a relief pattern and a substrate. The material is exposed to actinic radiation or a thermal treatment and the resulting patterned dielectric layer, having a three dimensional pattern, is used as part of a damascene or dual damascene process.

A damascene process is one in which wire trenches or via openings are formed in a dielectric layer, an electrical conductor of sufficient thickness to fill the trenches is deposited on a top surface of the dielectric, and a chemical-mechanical-polish (CMP) process is performed to remove excess conductor and make the surface of the conductor co-planar with the surface of the dielectric layer to form a damascene wires (or damascene vias). When only a trench and a wire (or a via opening and a via) is formed the process is called single-damascene.

A dual-damascene process is one in which via openings are formed through the entire thickness of a dielectric layer followed by formation of trenches part of the way through the dielectric layer in any given cross-sectional view. All via openings are intersected by integral wire trenches above and by a wire trench below, but not all trenches need intersect a via opening. An electrical conductor of sufficient thickness to fill the trenches and via openings is deposited on a top surface of the dielectric and a CMP process is performed to make the surface of the conductor in the trench co-planar with the surface the dielectric layer to form dual-damascene wires and dual-damascene wires having integral dual-damascene vias.

The present invention will be described in an exemplary dual damascene process, for forming wires with integral wires and vias; however it should be understood the method described is applicable to single damascene processes for forming wires or vias.

FIGS. 1A through 1F are cross sectional views of a method of fabricating a dual damascene wire common to both a first and a second embodiment of the present invention. In FIG. 1A, electrically conductive wires (or contact studs) 105 are formed in substrate 100. A top surface of wires 105 is coplanar with a top surface of substrate 100. An optional copper diffusion barrier 110 is formed on the top surfaces of wires 105 and substrate 100. In one example, copper diffusion barrier 110 is silicon nitride.

Figure 1B:
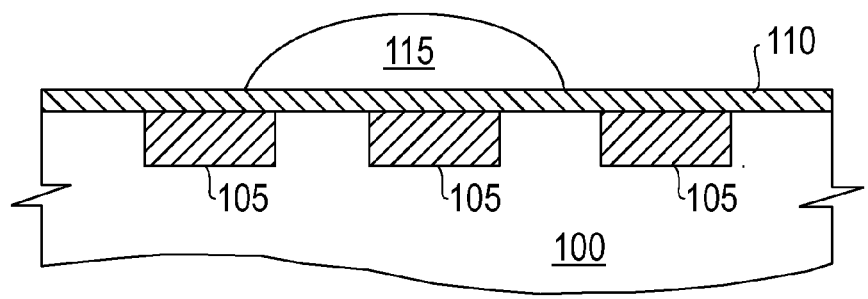

In FIG. 1B, a pool of dielectric precursor material 115 is applied. Precursor dielectric material 115 is a liquid. Dielectric precursor material 115 includes a poly-oxycarbosilane polymer, a silanol and a reaction initiator. The substituent groups of the poly-oxycarbosilane crosslink with the silanol in the presence of reaction initiator. In one example, dielectric precursor material 115 can include about 5-50 wt % of a pore generator.

Figure 1C:
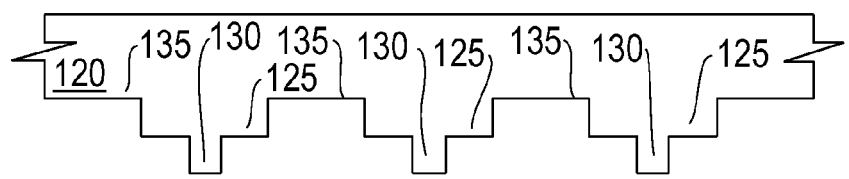
Figure 1C:
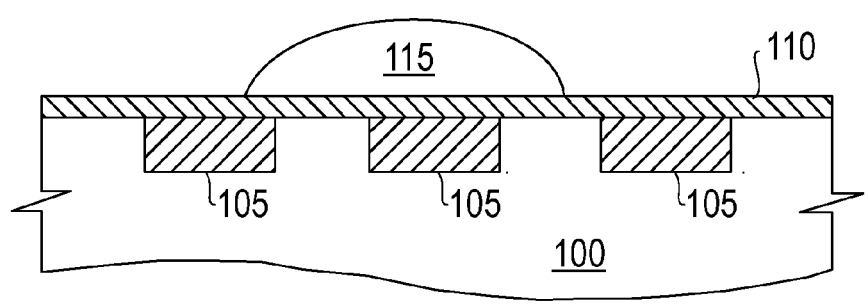

In FIG. 1C, an imprint template 120 includes a relief pattern made up of plateaus 125 and 130 rising above a reference surface 135. Plateaus 130 rise above plateaus 125. Imprint template 120 is pressed with a low pressure (i.e., less than about 1 psi) toward substrate 100, and the pool of dielectric precursor material 115 (see FIG. 1C) is spread out over copper diffusion barrier 110, completely filling the spaces between plateaus 125 and 130 and reference surface 135 and a top surface of copper diffusion barrier 110.

Figure 1D:
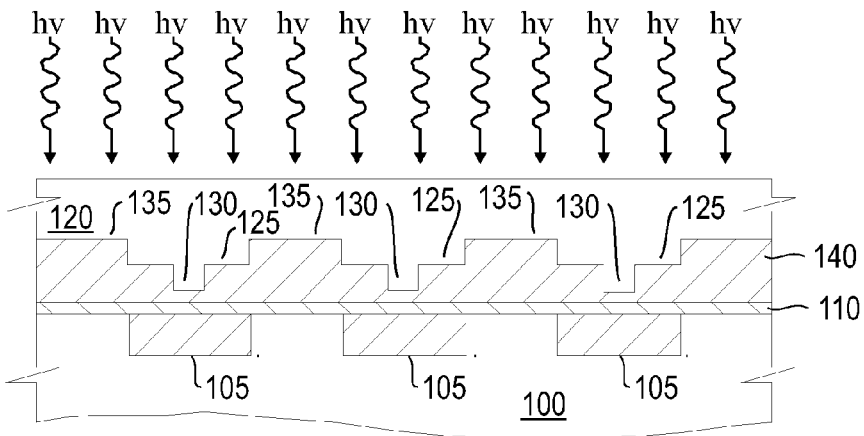

In FIG. 1D (FIG. 1D' and FIG. 1D"), after exposure to actinic radiation (e.g., ultraviolet (UV) radiation) FIG. 1D', or after a thermal treatment (FIG. 1D"), the dielectric precursor material 115 (see FIG. 1C) is converted (i.e. the poly-oxycarbosilane and the silanol are cross-linked) to a dielectric material 140.

Figure 1E:
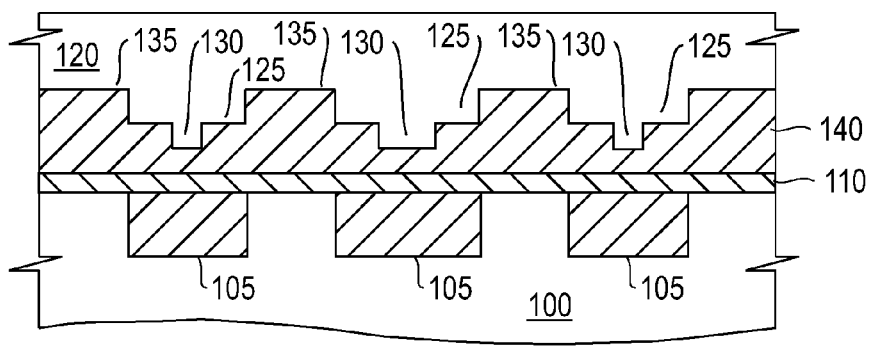
Figure 1E:
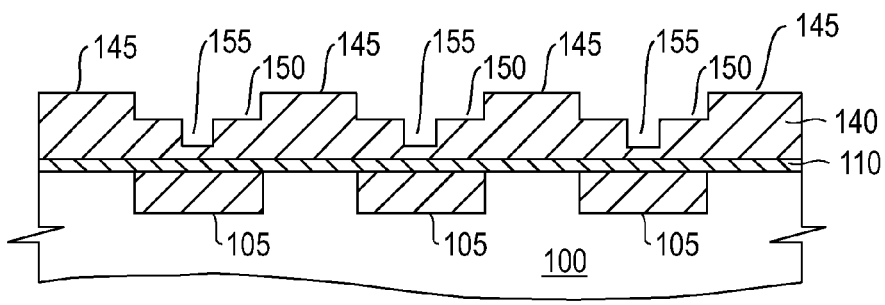

In FIG. 1E, template 120 is then removed exposing a top surface 145 of dielectric layer 140 and trenches 150 having integral pre-via openings 155 formed in the dielectric layer. Trenches 155 are open to top surface 145 of dielectric layer 140.

Figure 1F:
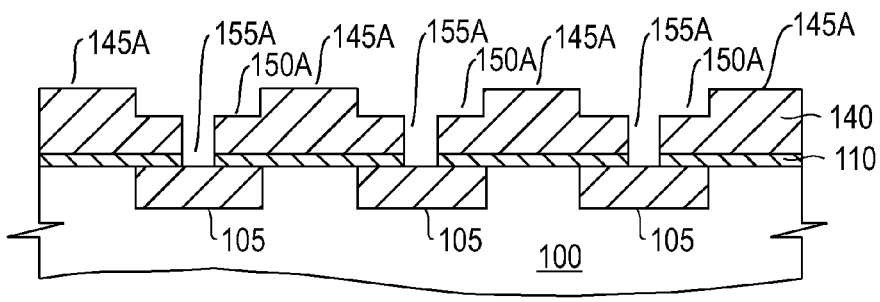

In FIG. 1F, a blanket etch is performed to remove any of dielectric layer 140 remaining in the bottom of via openings 155 (see FIG. 1E) and an additional etch is performed to remove copper diffusion barrier 110 at the bottom of the vias opening and expose wires 105. The blanket etch removes a portion of top surface 145 (see FIG. 1E) and creates a new top surface 145A of dielectric layer 140. Trench 150 (see FIG. 1D) is deepened to create trenches 150A and vias 155A. In one example, the blanket etch and the additional etch are reactive ion etches (RIEs). Alternatively, a single RIE etch may be performed to etch both dielectric layer 140 and copper diffusion barrier 110.

Figure 2A:
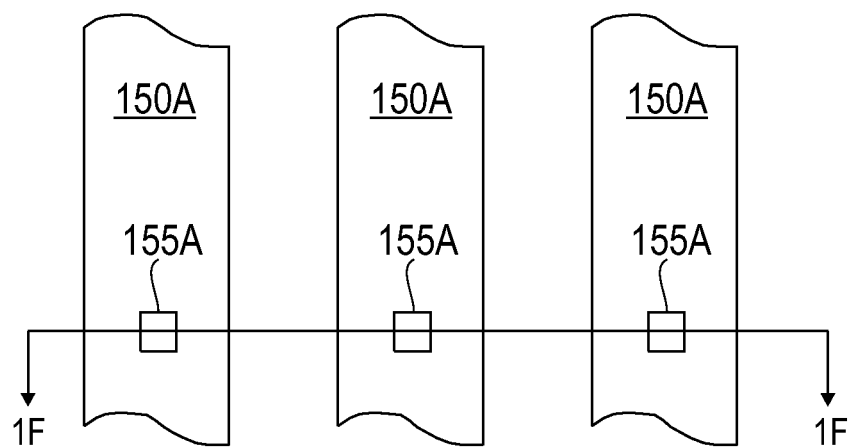

FIG. 2A is a top view illustrating the section through which FIG. 1F is taken. In FIG. 2A, trenches 150A extend laterally and via openings 155A are contained within the perimeter of trenches 150A. Alternatively, the two opposite sides of via openings 155A facing the sidewalls of the trench may extend to those sidewalls.

Figure 2B:
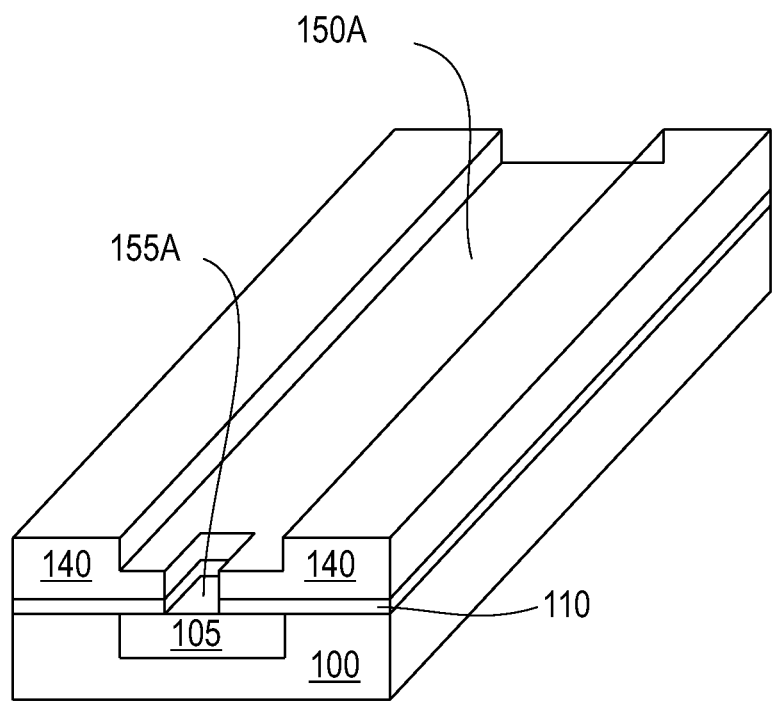
FIG. 2B is an isometric drawing of a trench and via opening as illustrated in FIG. 1F.

FIG. 2B is an isometric drawing of a trench and via opening as illustrated in FIG. 1F. In FIG. 2B, via opening 150A is shown in cutaway and it is clear that trench 155A is not as deep as via opening 150A.

Figure 3A:
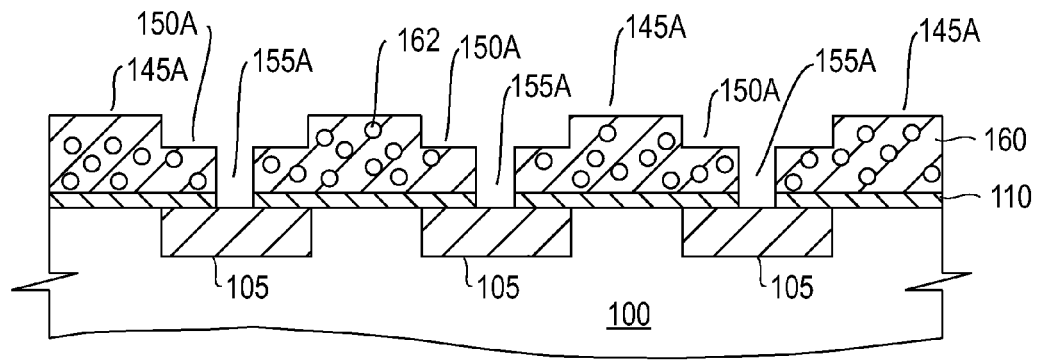
FIGS. 3A through 3C are cross sectional views of a method of fabricating a dual damascene wire according to an embodiment of the present invention.
Figure 3B:
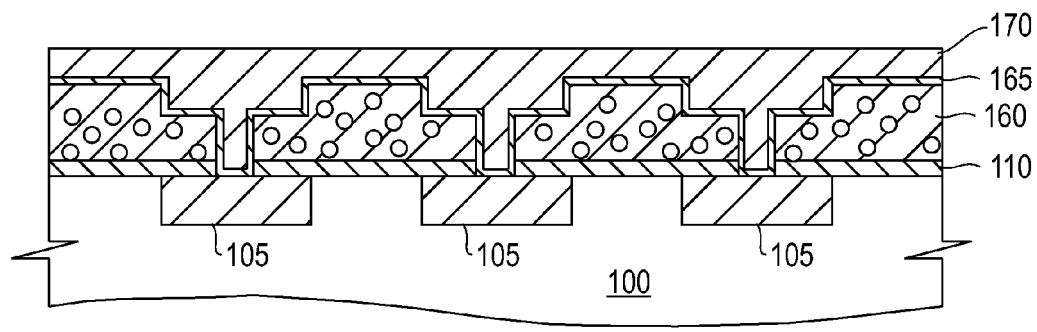
Figure 3C:
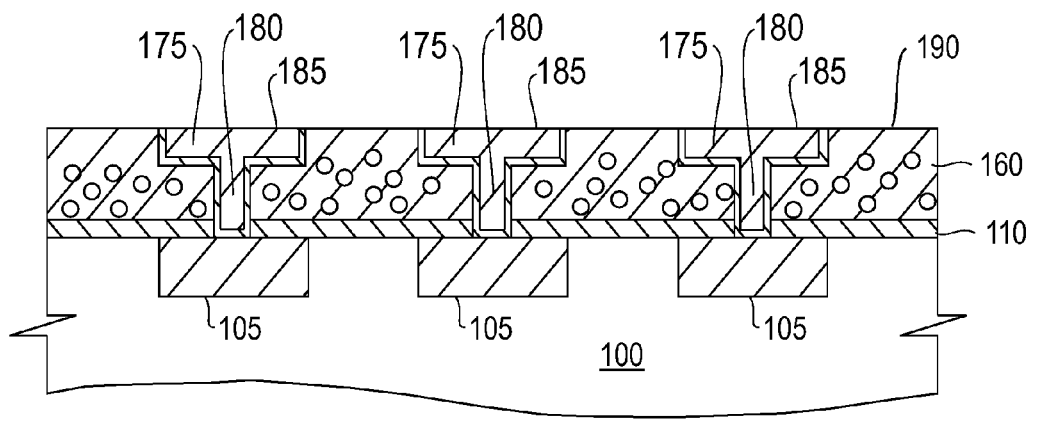

FIGS. 3A through 3C are cross sectional views of a method of fabricating a dual damascene wire according to the first embodiment of the present invention. In FIG. 3A, dielectric layer 140 (see FIG. 1F) is heated to a temperature high enough to fully cure the dielectric layer creating a porous dielectric layer 160 having pores 162. The high temperature cure performs two functions:

(1) the high temperature cure further improves the cross-linking between the poly-oxycarbosilane and the silanol containing materials forming a glass-like insulating film, and (2) the high temperature decomposes and volatilize and drives out carbonaceous materials such as pore generators, non-cross-linked poly-oxycarbosilane, non cross-linked silanol, photoacid generator and thermal acid generator.

The cure is preferably performed at a temperature of at least about 80° C. to about 600° C. for a period of about 5 to about 240 minutes. The cured non-porous dielectric film (dielectric film without pore generator) has a dielectric constant as low as 3.0. The cured porous dielectric film has a dielectric constant as low as 1.8.

In addition to or in place of the high temperature cures, a non thermal cure may be performed. Examples of non-thermal cures include but are not limited to exposure to ultra-violet radiation, microwave radiation or electron beams.

In FIG. 3B, a conformal electrically conductive layer 165 is formed on all exposed surfaces of porous dielectric layer 160 and wires 105 and an electrically conductive layer 170 of sufficient thickness to overfill trenches 150A (see FIG. 3A) is formed on top of conductive layer 165. In a first embodiment, the conductive layer 165 comprises tantalum, tantalum nitride, titanium, titanium nitride or combinations thereof. In a second embodiment, conductive layer 165 comprises a seed layer of copper formed, for example, by deposition or evaporation. In the first embodiment, conductive layer 170 comprises tungsten. In the second embodiment, conductive layer 170 comprises copper formed, for example, by electroplating.

In FIG. 3C, a chemical-mechanical-polish (CMP) is performed to form damascene wires 175 having integral vias 180, the vias being in physical and electrical contact with wires 105. Top surfaces 185 of wires 175 are coplanar with a top surface 190 of porous dielectric layer 160.

Figure 4A:
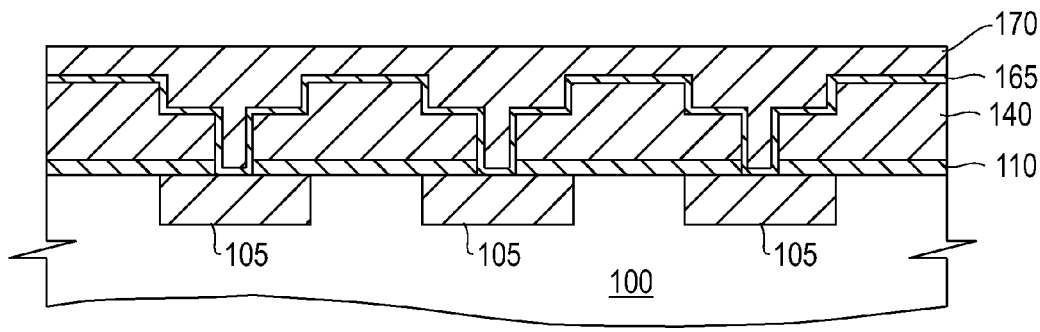
FIGS. 4A through 4C are cross sectional views of a method of fabricating a dual damascene wire according to an embodiment of the present invention.
Figure 4B:
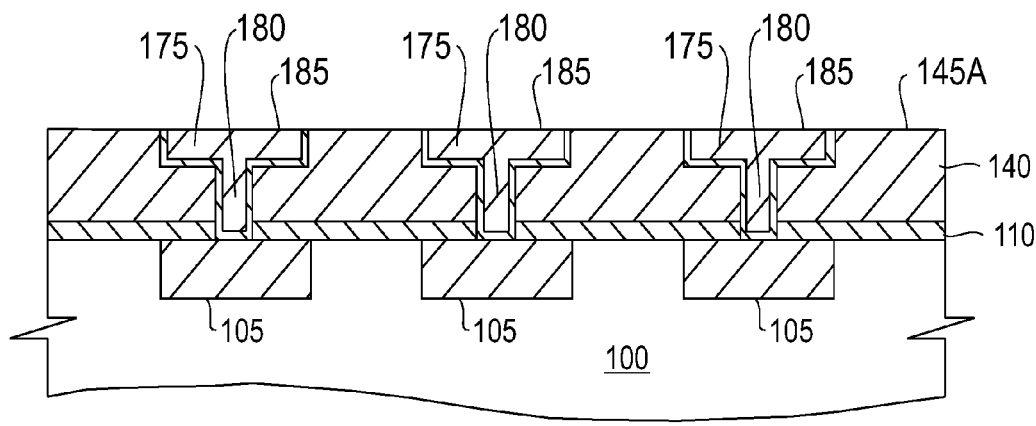
Figure 4C:
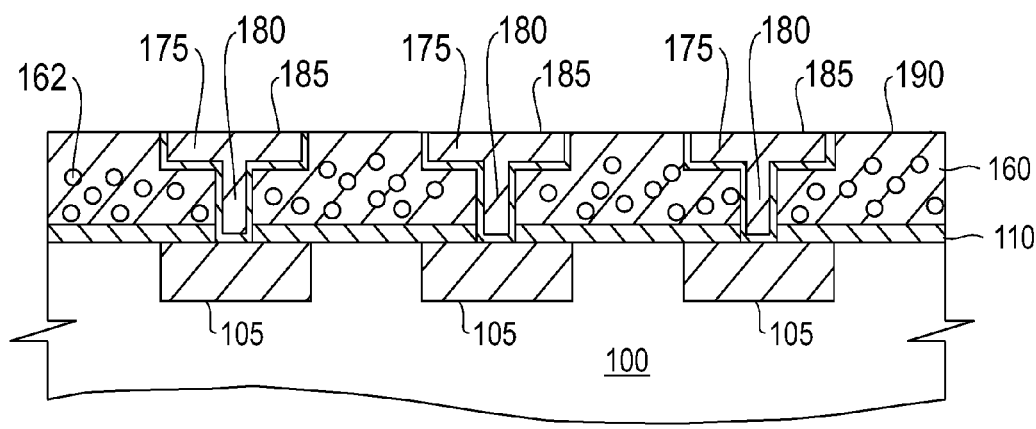

FIGS. 4A through 4C are cross sectional views of a method of fabricating a dual damascene wire according to another embodiment of the present invention. In FIG. 4A, conformal electrically conductive layer 165 is formed on all exposed surfaces of dielectric layer 140 and wires 105 and electrically conductive layer 170 of sufficient thickness to overfill trenches 150A (see FIG. 3A) is formed on top of conductive layer 165.

In FIG. 4B, a CMP is performed to form damascene wires 175 having integral vias 180, the vias being in physical and electrical contact with wires 105. Top surfaces 185 of wires 175 are coplanar with a top surface 145A of dielectric layer 140.

In FIG. 4C, dielectric layer 140 (see FIG. 4B) is heated to a temperature high enough to fully cure the dielectric layer creating a porous dielectric layer 160 having pores 162.

EXAMPLES

The poly-oxycarbosilane polymer was purchased from Starfire, Inc. Silanol containing materials are methylsilsesquioxane polymers obtained from JSR Micro Corp. The thermal acid generator was purchased from CIBA or Aldrich Chemical Company. All the other chemicals were purchased from Aldrich Chemical Company. The following examples are intended to provide those of ordinary skill in the art with a complete disclosure and description of how to prepare and use the compositions disclosed and claimed herein. Efforts have been made to ensure accuracy with respect to numbers (e.g., amounts, temperature, etc.), but allowance should be made for the possibility of inadvertent errors and deviations.

The imprints of the imprinting formulations were fabricated on Instron 5500R tool. The imprint force applied was set to approximately 400 newtons. Films thicknesses and refractive indices were measured using a Filmetrics F20 Thin-Film Measurement System. Dielectric constants were determined using a capacitance bridge with an HP 4192A impedance analyzer using a metal insulator semi-conductor structure. Measurements were done at 25° C. and 100 KHz. Young's modulus measurements were obtained using a Fraunhofer LAWave surface acoustic wave spectrometer (SAWS) operating between 50 MHz-200 MHz and sampling each specimen at five different spots. Densities were determined by specular x-ray reflectivity.

Example 1

Synthesis of a Low-K Porous Film Based on Dimethoxy-Polycarbosilane

A low-k composition was formulated with 2.24 g dimethoxy-polycarbosilane (20 Wt % in 1-methoxy-2-propanol), 0.56 g MSSQ (GR-650, or JSR low MW, or JSR high MW, 20 Wt % in 1-methoxy-2-propanol), 1.2 g porogen (heptakis(2,3,6-tri-O-methyl-beta cyclodextrin) or PPG 6 k, 20 wt % in 1-methoxy-2-propanol) and 0.0448 g of TAG. This mixture is spin-coated @3 k for 30 sec on a silicon wafer. The film is cured at 120° C. for 1 h and then at 450° C. for 2 h (heating rate: 5 c/min). Results are presented in Table 1.

TABLE 1

SYNTHESIS AND PROPERTIES OF POROUS POLY-OXYCARBOSILANE FILMS

| MSSQ | Porogen (loading Wt %) | Thickness (nm) | RI | k @ 25 C. | $E_{SAWS}$ (GPa) |
|---|---|---|---|---|---|
| GR-650 | PPG (30) | 454.29 | 1.2742 | 2.17 | 1.37 |
| GR-650 | CD (30) | 415.09 | 1.2872 | N/A | 0.90 |
| JSR (low MW) | PPG (30) | 432.58 | 1.2654 | 2.19 | 1.07 |
| JSR (low MW) | CD (30) | 356.51 | 1.2689 | 2.23 | 1.69 |
| JSR (high MW) | PPG (30) | 543.49 | 1.2383 | 1.91 | 0.89 |
| JSR (high MW) | CD (30) | 360.70 | 1.3321 | N/A | 3.53 |

Evidence of cross-linking between the poly-oxycarbosilane and the MSSQ was obtained using FTIR. Indeed the IR spectrum of the porous films show the band characteristic of Si—CH2-Si at 1350 cm-1 from the poly-oxycarbosilane, as well as the band characteristic of Si—CH3 at 1280 cm-1 from the MSSQ.

Solutions composed of the dimethoxy polycarbosilane and TAG or MSSQ were also spin-coated and cured under identical conditions. No films were obtained after the thermal process demonstrating that the three aforementioned components are necessary to promote the cross-linking of the poly-oxycarbosilane polymer.

Example 2

Nanoimprinting of Low-K Composition Based on Dimethoxy-Polycarbosilane

Figure 5:
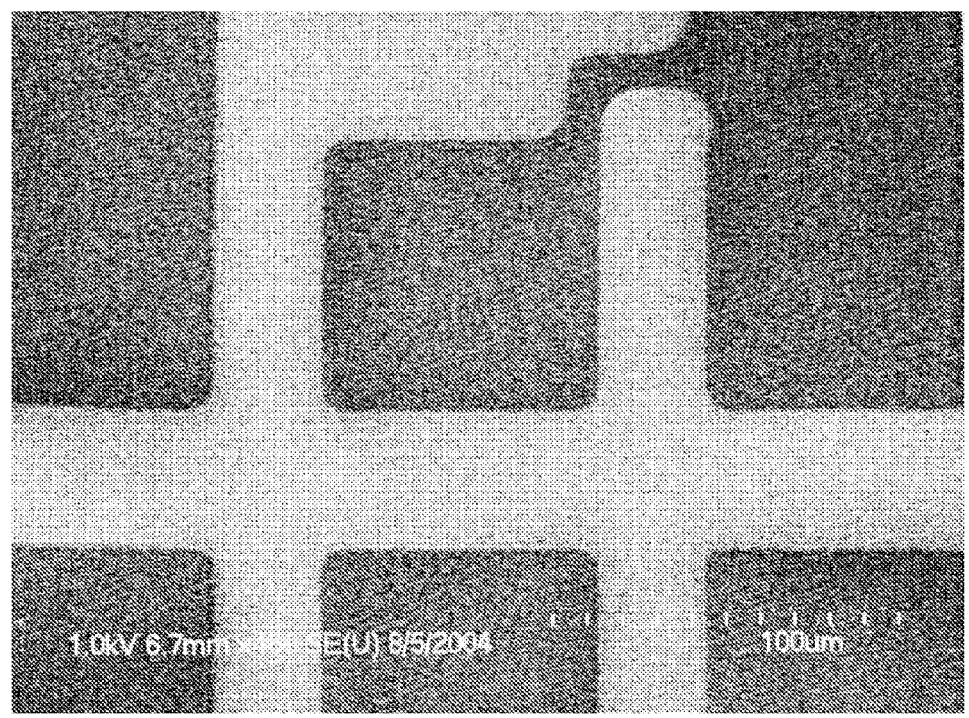
FIG. 5 is an SEM photomicrograph of imprinted structures formed from imprinting compositions according to an embodiment of the present invention.

A solvent free low-k formulation for nanoimprinting was formulated as follows: 0.168 g dimethoxy-polycarbosilane, 0.042 g GR-650 (flakes), and 0.0168 g of TAG. This mixture is spin-coated @3 k for 30 sec on a silicon wafer after which a mold is placed over the film and compressed with a force of 400N. The film is cured at 120° C. for 1 h and then the mold is removed. After rinsing the film several times with acetone all the features remained intact, thus indicating that cross-linking had taken place at this stage. In a second processing step this imprinted film was cured at 450° C. for two hours. A top down SEM of nominal 30 micron line/space features obtained are illustrated in FIG. 5.

The use of the terms "a" and "an" and "the" and similar referents in the context of describing the invention (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

We claim:

1. A composition comprising a silsesquioxane, a reaction initiator, a pore generator, and a polymer comprising a repeating unit having a structure selected from structures I and II:

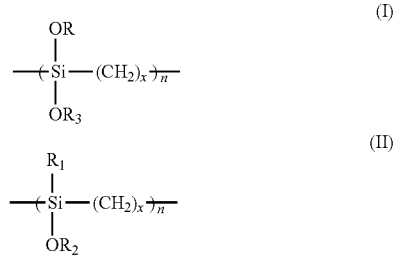

wherein each of R, $R_1$, $R_2$ and $R_3$ is independently selected from hydrido, $C_{1-6}$ alkyl and haloalkyl; $C_{4-7}$ cycloalkyl and halocycloalkyl; $C_{1-6}$ alkenyl and haloalkenyl; $C_{3-4}$ alkylenylcarbonyloxy; $C_{5-10}$ cycloalkylenylcarbonyloxy and $C_{6-12}$ aryl and haloaryl; x is 1-4 and n=2-5000, wherein the reaction initiator is selected from the group consisting of a photo radical initiator, a thermal radical initiator, a photoacid generator, a photo base generator, and a thermal base generator, and wherein the composition is solvent-free.

2. The composition of claim 1, wherein the silsesquioxane has a formula selected from the group consisting of $R_3SiO_{1.5}$ and $R_4SiO_{1.5}$—$SiO_2$, wherein $R_3$ and $R_4$ are independently selected from $C_{1-6}$ alkyl and $C_{6-12}$ aryl.

3. The composition of claim 1, wherein the photo radical initiator is selected from the group consisting of an acetophenone, anisoin, an anthraquionone, a benzophenone, a benzoin ether, and benzyl.

4. The composition of claim 1, wherein the photoacid generator is selected from the group consisting of a sulfonium salt, an iodonium salt, benzoin tosylate, and materials represented by structures (III), (IV), and (V), wherein $T_f$ is $CF_3S(O)_2O^-$:

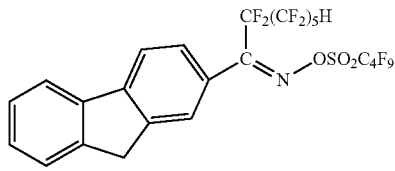

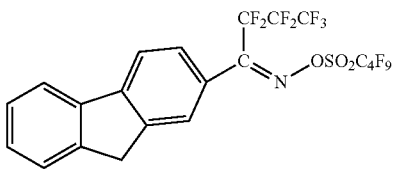

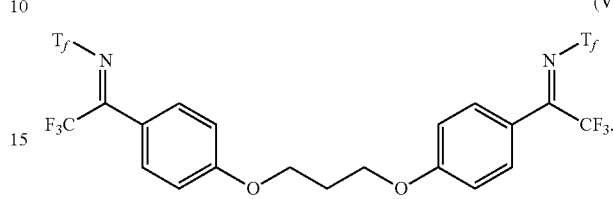

5. The composition of claim 1, wherein the pore generator is selected from the group consisting of a polyester, a polylactide, a polystyrene, a substituted polystyrene, a poly-alpha methyl styrene, a substituted poly-alpha methyl styrene, an aliphatic olefin, a polynorbornene, a polyacrylate, a polymethacrylate, and an aliphatic polyether.

6. A composition comprising a silsesquioxane, a photoacid generator, a pore generator, and a polymer comprising a repeating unit having a structure selected from structures I and II:

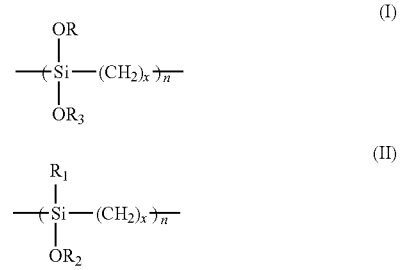

wherein each of R, $R_1$, $R_2$, and $R_3$ is independently selected from hydrido and $C_{1-6}$ alkyl; x is 1-4; and n=2-500, and wherein the composition is solvent-free.

7. The composition of claim 6, wherein the silsesquioxane has a formula selected from the group consisting of $R_3SiO_{1.5}$ and $R_4SiO_{1.5}$—$SiO_2$, wherein $R_3$ and $R_4$ are independently selected from $C_{1-6}$ alkyl and $C_{6-12}$ aryl.

8. The composition of claim 6, wherein the photoacid generator is selected from the group consisting of a sulfonium salt, an iodonium salt, benzoin tosylate, and materials represented by structures (III), (IV), and (V), wherein $T_f$ is $CF_3S(O)_2O^-$:

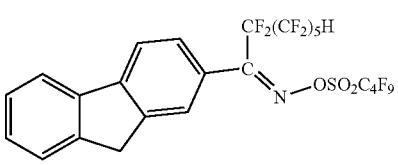

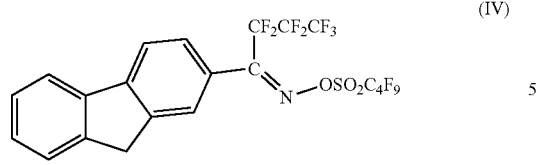 (IV)
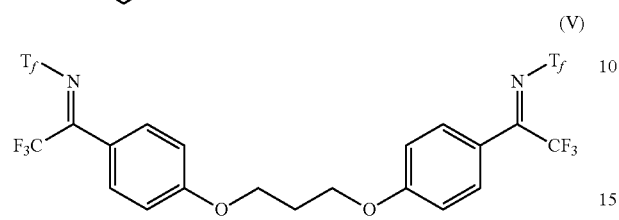 (V)
* * * * *